United States Patent
Baker et al.

(10) Patent No.: US 11,115,147 B2
(45) Date of Patent: Sep. 7, 2021

(54) MULTICHIP FAULT MANAGEMENT

(71) Applicant: Groq, Inc., Menlo Park, CA (US)

(72) Inventors: Matthew Pond Baker, San Francisco, CA (US); Srivathsa Dhruvanarayan, Saratoga, CA (US); Boone Jared Severson, Pleasanton, CA (US)

(73) Assignee: Groq, Inc., Mountain View, CA (US)

( * ) Notice: Subject to any disclaimer, the term of this patent is extended or adjusted under 35 U.S.C. 154(b) by 227 days.

(21) Appl. No.: 16/243,768

(22) Filed: Jan. 9, 2019

(65) Prior Publication Data

US 2020/0220643 A1 Jul. 9, 2020

(51) Int. Cl.
*H04J 14/02* (2006.01)
*H04W 28/02* (2009.01)
*H03K 19/177* (2020.01)

(52) U.S. Cl.
CPC ........ *H04J 14/0283* (2013.01); *H03K 19/177* (2013.01); *H04J 14/022* (2013.01); *H04W 28/0278* (2013.01)

(58) Field of Classification Search
CPC .. H04J 14/0283; H04J 14/022; H03K 19/177; H04W 28/0278
See application file for complete search history.

(56) References Cited

U.S. PATENT DOCUMENTS

| | | | |
|---|---|---|---|
| 6,279,057 B1 * | 8/2001 | Westby | G06F 3/0619 710/52 |
| 6,681,316 B1 * | 1/2004 | Clermidy | G06F 11/2025 712/11 |
| 7,339,941 B2 * | 3/2008 | Twomey | H04L 12/42 370/401 |
| 7,965,725 B2 * | 6/2011 | Langevin | H04L 49/15 370/405 |
| 8,345,540 B2 * | 1/2013 | Rollins | H04L 12/437 370/222 |
| 8,830,993 B1 * | 9/2014 | Dublin | H04L 49/00 370/376 |
| 8,850,262 B2 * | 9/2014 | Cardinell | G06F 11/0757 714/10 |
| 8,989,220 B2 * | 3/2015 | Scrobohaci | H04L 47/39 370/474 |
| 9,535,869 B2 * | 1/2017 | Zheng | G06F 15/7867 |
| 9,639,490 B2 * | 5/2017 | Blankenship | G06F 13/1668 |

(Continued)

OTHER PUBLICATIONS

PCT International Search Report and Written Opinion, PCT Application No. PCT/US2019/068767, dated Mar. 17, 2020, 14 pages.

*Primary Examiner* — Huy D Vu
*Assistant Examiner* — Bailor C. Hsu
(74) *Attorney, Agent, or Firm* — Fenwick & West LLP

(57) ABSTRACT

Embodiments of the present disclosure pertain to improved circuit and system architectures for identifying and managing operating statuses and faults in a system having multiple processing circuit chips. Each of the multiple processing circuit chips includes multiple signal rings, one to provide internal communications among circuitry within the circuit chip, and another with inter-chip communications circuitry to provide communications with neighboring circuit chips. One of the multiple processing circuit chips further includes external communications circuitry to provide communications with an external host.

15 Claims, 3 Drawing Sheets

(56) References Cited

U.S. PATENT DOCUMENTS

| | | | |
|---|---|---|---|
| 2003/0206527 A1* | 11/2003 | Yim | H04L 47/10 370/238 |
| 2011/0173258 A1* | 7/2011 | Arimilli | G06F 15/16 709/204 |
| 2017/0063609 A1 | 3/2017 | Philip et al. | |
| 2017/0085475 A1* | 3/2017 | Cheng | H04L 12/42 |
| 2018/0145850 A1 | 5/2018 | Tam et al. | |
| 2019/0089619 A1* | 3/2019 | Yeager | H04L 43/50 |

* cited by examiner

MULTICHIP FAULT MANAGEMENT

BACKGROUND

The present disclosure relates to data processing circuits, and in particular, to a system having multiple processing circuit chips in which their respective operational statuses and detected faults may be managed.

Individual data processing circuits of all types continue to add more advanced functions and operate at increasing clock rates and increasing parallelism. Some integrated circuits, or "chips", also include multiple circuits having disparate functions to provide what is generally referred to a system on a chip, or SoC. However, even with such increased chip capabilities, even more processing power may be needed. One result of this has been more systems relying upon such circuits scaling up further by operating multiple such chips together to achieve even greater increased processing power and/or parallelism as well as increased memory capacity (e.g., by enabling access to memory across a network of multiple devices, whether similar or dissimilar).

Such increased processing power and/or parallelism tend to also increase complexity and costs of maintaining common and important functions and/or operations, such as monitoring and/or managing enablement and disablement of circuit functions, states of operation and detected faults for each of the multiple processing circuit chips within the scaled systems. For example, to individually monitor and/or report operating parameters and/or faults of interest even within just each individual chip, using multiple dedicated signal lines can require significant physical space as well as processing overhead that will generally see little actual use since system state changes and faults tend to be infrequent (e.g., generally limited to time intervals during or immediately following power on self-test (POST) and/or system reboot sequences).

The present disclosure provides improved circuit and system architectures for monitoring and managing operational statuses and detected faults in systems having multiple processing circuit chips.

SUMMARY

Embodiments of the present disclosure pertain to improved circuit and system architectures for identifying and managing operating statuses and faults in a system having multiple processing circuit chips. Each of the multiple processing circuit chips includes multiple signal rings, one to provide internal communications among circuitry within the circuit chip, and another with inter-chip communications circuitry to provide communications with neighboring circuit chips. One of the multiple processing circuit chips further includes external communications circuitry to provide communications with an external host.

In accordance with one embodiment, each of a plurality of processing circuit chips includes multiple internal signal rings configured to convey at least first and second groups of internal data packets having an internal format, and multiple internal circuits coupled to the internal signal rings. One of the internal circuits is coupled to a first ring and a second ring of the internal signal rings and configured to receive and transfer the first and second groups of internal data packets via the first and second rings, respectively, and between the first and second rings. Another of the internal circuits is coupled to the first ring and the second ring and configured to: receive and transfer the first and second groups of internal data packets via the first and second rings, respectively; transform part of the first group of internal data packets to outgoing inter-chip data packets having an inter-chip format; and transform incoming inter-chip data packets having the inter-chip format to another part of the first group of internal data packets. Another of the internal circuits is coupled to the second ring and configured to receive and transfer the second plurality of internal data packets via the second ring only.

In accordance with another embodiment, each of a plurality of processing circuit chips includes internal signal conveyance means for conveying at least first and second groups of internal data packets having an internal format, and internal circuit means for communicating with the internal signal conveyance means. Such internal circuit means includes first, second and third circuit means. The first circuit means is for receiving and transferring the first and second groups of internal data packets via first and second portions of the internal signal conveyance means, respectively, and between the first and second portions. The second circuit means is for receiving and transferring the first and second groups of internal data packets via the first and second portions of the internal signal conveyance means, respectively; transforming part of the first group of internal data packets to outgoing inter-chip data packets having an inter-chip format; and transforming incoming inter-chip data packets having the inter-chip format to another part of the first group of internal data packets. The third circuit means is for receiving and transferring the second plurality of internal data packets via the second ring only.

In accordance with another embodiment, a method of processing with multiple processing circuit chips includes: providing multiple internal signal rings configured to convey at least first and second groups of internal data packets having an internal format; providing multiple internal circuits coupled to the internal signal rings; receiving and transferring, with a first portion of the multiple internal circuits coupled to a first ring and a second ring of multiple internal signal rings, the first and second groups of internal data packets via the first and second rings, respectively, and between the first and second rings; operating a second portion of the multiple internal circuits, coupled to the first ring and the second ring, to receive and transfer the first and second groups of internal data packets via the first and second rings, respectively, to transform a portion of the first group of internal data packets to outgoing inter-chip data packets having an inter-chip format, and to transform incoming inter-chip data packets having the inter-chip format to another portion of the first group of internal data packets; and receiving and transferring, with a third portion of the multiple internal circuits coupled to the second ring, the second group of internal data packets via the second ring only.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Features and advantages of the present disclosure include a system having multiple processing circuit chips, each of which includes multiple internal signal rings to transport internal data packets having an internal format among internal processing circuitry, and inter-chip communications circuitry to transport inter-chip data packets having an inter-chip format, thereby enabling communication of operating status and detected faults of each chip among other chips. The following discussion identifies relevant circuitry of example embodiments, followed by descriptions of example transactions using such circuitry.

Figure 1:
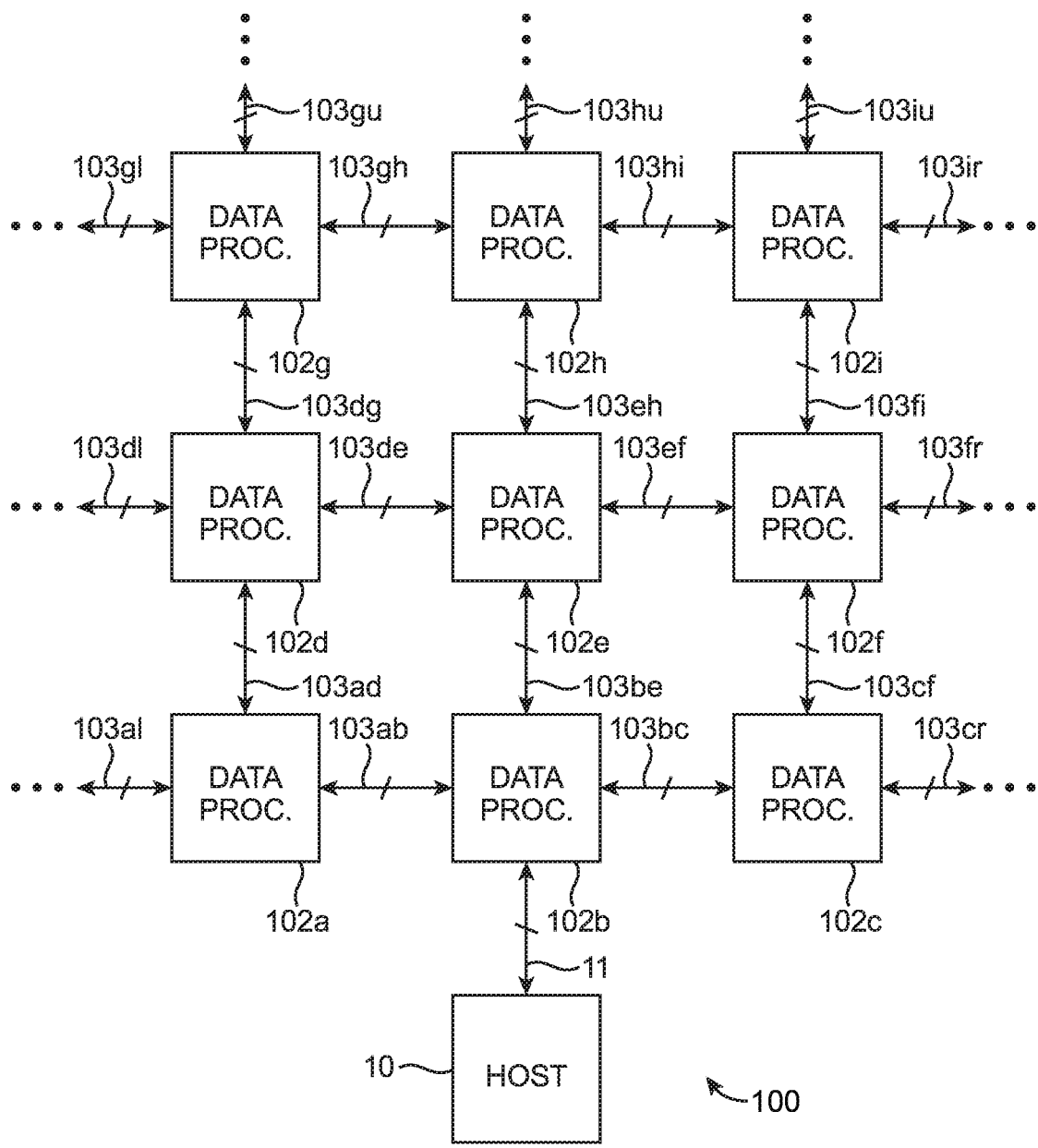
FIG. 1 illustrates an example of multiple processing circuit chips mutually connected for contemporaneous operation according to one embodiment.

FIG. 1 illustrates an example of multiple processing circuit chips mutually connected for contemporaneous operation according to one embodiment in which multiple processing circuit chips 102 (e.g., 102a-102i, . . . ) are connected in an array, or matrix, configuration 100. However, as will be readily appreciated by one of ordinary skill in the art from the following discussion, they may also be connected in other ways, such as ring, mesh or star topologies. As discussed in more detail below, each processing circuit chip 102 includes inter-chip communications circuitry to enable communications with one or more neighboring chips 102 via one or more inter-chip communications paths 103. For example, a chip 102e located within the array 100 may be interconnected with multiple neighboring chips 102, e.g., a chip 102h to the "north" via an inter-chip communication path 103eh, a chip 102f to the "east" via an inter-chip communication path 103ef, a chip 102b to the "south" via an inter-chip communication path 103be, and a chip 102d to the "west" via an inter-chip communication path 103de. The remaining chips 102 within the array include similar interconnections with their respective neighboring chips 102.

Such an inter-chip communications path 103 may be implemented in accordance with any of numerous well known, general purpose input/output (I/O) signal protocols. For example, various forms of inter-chip signal connectivity (e.g., also referred to as chip-to-chip or die-to-die links) are well known to provide signal communications between different chips to share computing resources, limit chip-to-chip latency, and/or maintain the highest possible chip-to-chip communications bandwidth. For example, a serializer/deserializer (SerDes) may be used. As is well known in the art, a SerDes may be implemented as a pair of logic blocks in high speed communications to compensate for limited input/output lines/capacity by converting bidirectional data between inter-chip serial data and intra-chip parallel interfaces. One example of such a SerDes interface is known as Chip to Chip Link (also known as "C2C" which is a trademark of Texas Instruments, Inc.) and enables connections between two chips without a physical layer (PHY), e.g., using only double data rate (DDR) pads.

At least one chip 102b will further include host interface circuitry (discussed in more detail below) to enable external communications with a host system 10 via an external, or off-chip, communications path 11. Various forms of off-chip connectivity are well known to provide signal communications between systems of chips within or otherwise associated with a host system. One common example of such connectivity, known as Peripheral Component Interconnect Express (also known as PCI Express and often abbreviated as PCIe or PCI-e), is a high-speed serial computer expansion bus standard that enables high maximum system bus throughput, low input/output (I/O) pin count and detailed error detection and reporting mechanisms.

Figure 2:
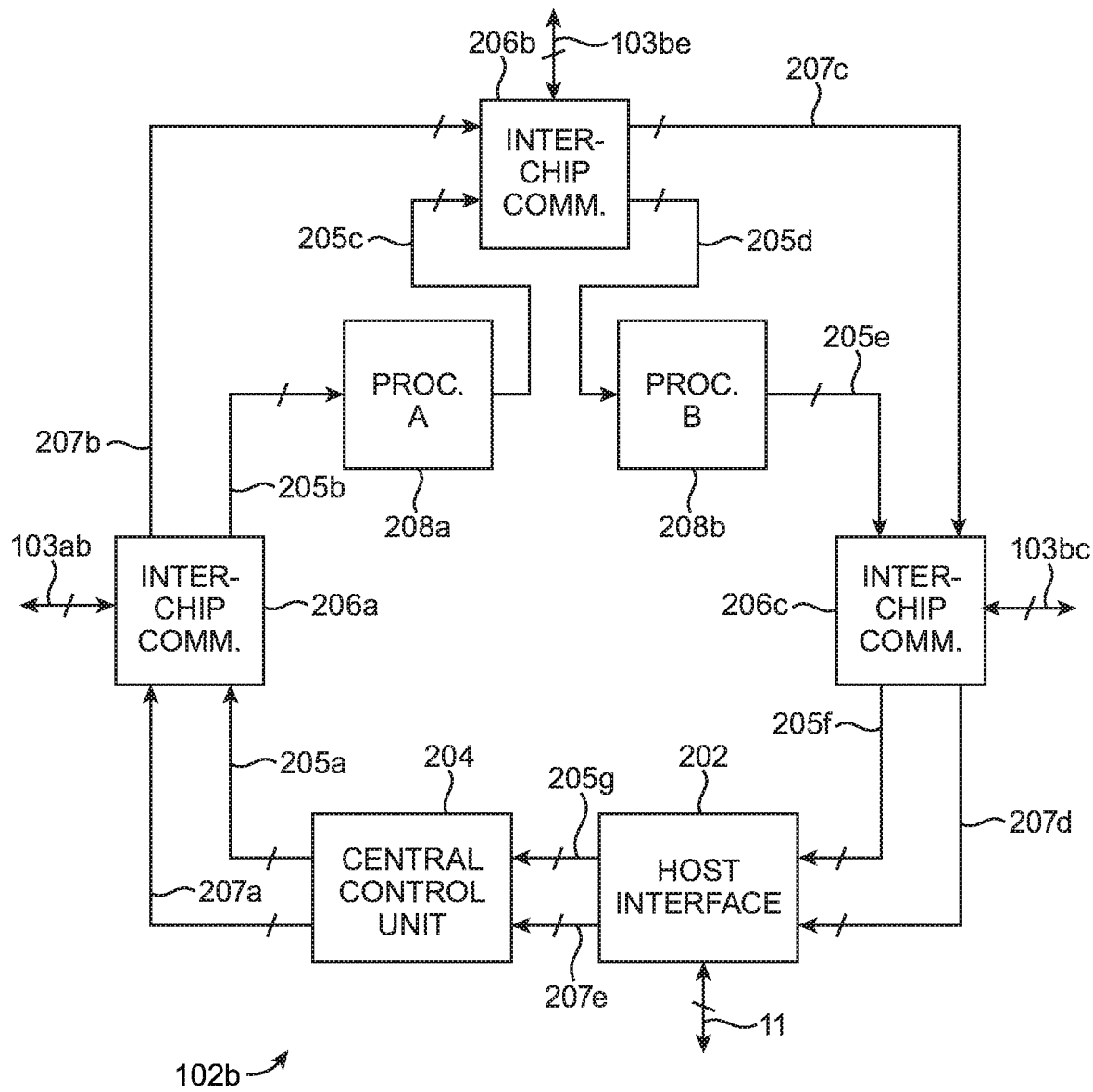
FIG. 2 illustrates an example of one of the multiple processing circuit chips according to one embodiment.

FIG. 2 illustrates an example of one of the multiple processing circuit chips according to one embodiment. As noted above, in addition to its resources for performing its core data processing function(s), each chip 102 also includes resources for providing internal, or intra-chip, communications, providing inter-chip communications with neighboring chips 102, and controlling and/or coordinating intra-chip and inter-chip communications. In this example, the chip 102b that includes host interface circuitry is discussed for completeness, with the understanding that other chips will be similar but with either no host interface circuitry included or any included host interface circuitry either disabled or otherwise unused.

For core data processing function(s), one or more data processing circuits 208 may be included to perform various functions and/or operations for purposes of the system of chips 100. For example, such processing circuits 208 may be microprocessors, microcontrollers, programmable gate arrays, graphics processing units, or other programmable and/or application specific processing circuits.

For intra-chip communications, internal signal paths 205, 207 (each of which may include one or more multi-bit signal paths, as discussed in more detail below) provide signal rings, or rails, via which intra-chip communications may occur in the form of circulation of instructions, queries and data (discussed in more detail below) among the various internal circuits. For example, an "internal" ring 205 enables solely intra-chip communications (discussed in more detail below) via multiple ring segments 205a-205g connecting the data processing circuits 208, inter-chip communications circuits 206, control circuitry 204, and, in this case, host interface circuitry 202. Similarly, an "external" ring 207 enables intra-chip communications (discussed in more detail below) via multiple ring segments 207a-205e connecting the data processing circuits 208, inter-chip communications circuits 206, control circuitry 204, and host interface circuitry 202. Accordingly, the network of which the array 100 is a part becomes decentralized since the host system 10 may receive data packets that originate locally from the host interface circuitry 202 or that originate remotely from another chip 102 and arrive via an inter-chip communications circuit 206 and the "external" ring 207.

For inter-chip communications, one or more communications circuits 206 may be included as needed for the number, and interconnection topology, of processing chips 102 to be employed. In some instances, multiple such circuits 206 with one or more disabled or otherwise unused may be included to enable future scaling up of resources within the system of chips 100.

For controlling and/or coordinating the intra-chip and inter-chip communications, the control circuitry 204 serves as a central control unit (CCU) to control inter-ring transfers of instructions, queries and data between the rings 205, 207, as well as routing of data packets from the local, or current, chip 102 via the inter-chip communication paths 103 to a remote communications circuit 206 for conveyance to another chip 102 within the array 100. For example, as discussed in more detail below, the CCU 204 may use address information included with or otherwise associated with transient data packets passing through it (e.g., as provided by the host system 10, by a data processing circuit 208 within the local processing chip 102, or by a data processing circuit 208 within a remote processing chip 102) to direct and initiate transfers of data packets between the rings 205, 207 within the local processing chip 102, or, if the address information identifies a remote destination, route such data packets to a local communications circuit 206 for transmission to a remote communications circuit 206 resident in another chip 102 within the array 100.

Figure 3:
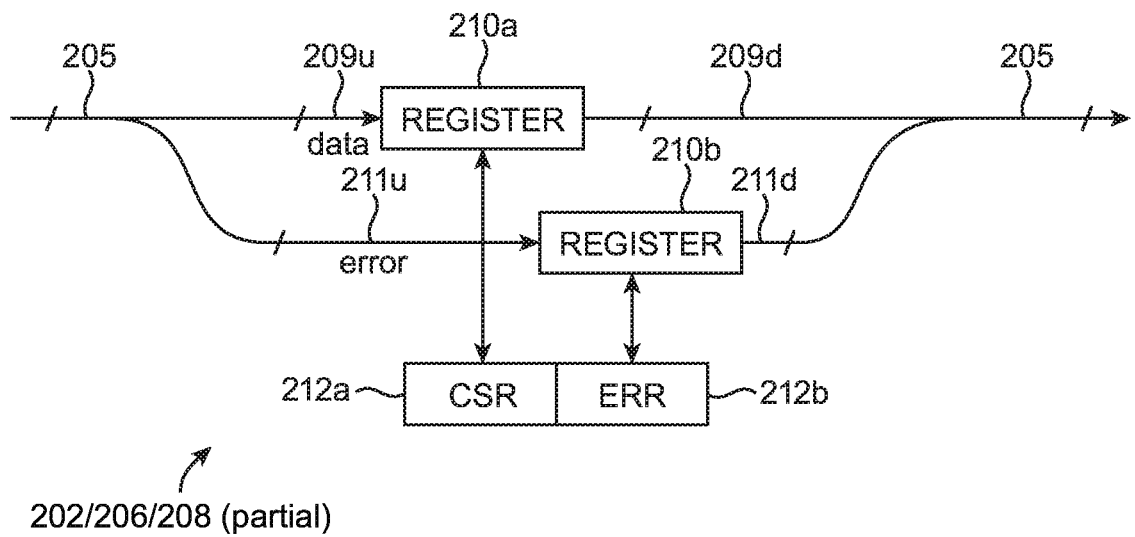
FIG. 3 illustrates an example of query and data transfer elements for the internal data ring of the processing circuit chips according to one embodiment.

FIG. 3 illustrates an example of query and data transfer elements for the internal data ring of the processing circuit chips according to one embodiment. As noted above, the host interface circuitry 202, inter-chip communications circuits 206 and data processing circuits 208 convey data packets via various segments of the "internal" ring 205. This ring 205 may be multiple bits wide to enable intra-chip communications of data packets having a desired number of bits that can be transferred all at one time (e.g., in a single clock cycle) from one circuit 202, 206, 208 to the next. This ring 205 may also include multiple components, such as a data ring component 209 (e.g., M bits wide, where M>1) and an error ring component 211 (e.g., N bits wide, where N>1) for conveying an M-bit wide data packet and an N-bit wide error packet (e.g., in which each bit identifies a particular type or urgency of an error to be reported).

As discussed in further detail below, transactions are conducted in which one or more faults detected within the array 100 are reported, and/or responses to such reported faults are initiated. During such transactions, a locally detected fault (e.g., within the current host interface circuitry 202, inter-chip communications circuit 206 or data processing circuit 208) causes a chip status register (CSR) 212a to be loaded with data identifying details of the detected fault, and one or more corresponding bits within an error register 212b to be set or reset to identify (e.g., in more general terms) a severity and/or urgency of the detected fault. Such fault data and error bits may then be transferred into registers 210a, 210b within the internal ring 205 for conveyance of the fault data and error bits downstream to the local CCU 204. Alternatively, if no local fault data and/or error bits are generated, the registers 210a, 210b may receive and further convey fault data and/or error bits from upstream segments 209u, 211u to downstream segments 209d, 211d of the data 209 and error 211 components of the "internal" ring 205.

Figure 4:
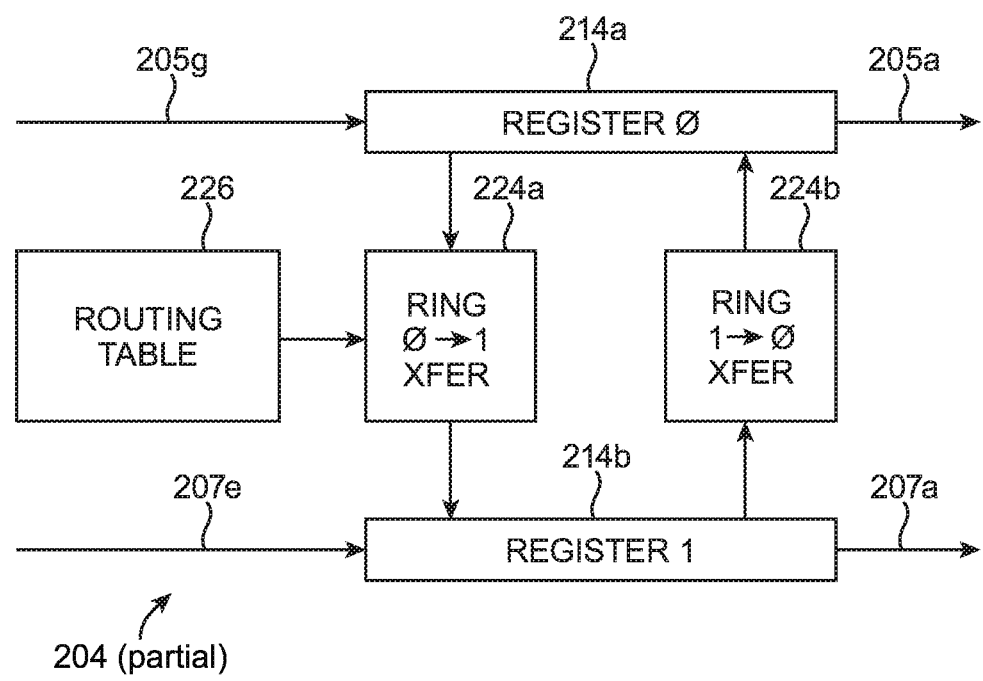
FIG. 4 illustrates an example of data transfer elements for the internal and external data rings of the processing circuit chips according to one embodiment.

FIG. 4 illustrates an example of data transfer elements for the internal and external data rings of the processing circuit chips according to one embodiment. As noted above, a CCU controls inter-ring transfers of instructions, queries and data between the rings 205, 207. As discussed above, fault data and/or error bits from the host interface circuitry 202, inter-chip communications circuits 206 and data processing circuits 208 arrive via an upstream internal ring segment 205g and are captured in an internal ring register 214a. Similarly, new data from the host interface circuitry 202 and other data from inter-chip communications circuits 206 (either intra-chip generated locally within the current chip, or inter-chip arriving from another chip) and data processing circuits 208 arrive via an upstream external ring segment 207e, and are captured in an external ring register 214b.

Transfers of fault data and/or error bits between the rings, 205, 207 (discussed in more detail below) may be performed by ring transfer circuitry 224 between the ring registers 214. For example, transfers of fault data and/or error bits from the internal ring 205 to the external ring 207 may be done via an internal-to-external ring transfer circuit 224a from the internal ring register 214a to the external ring register 214b. As discussed above, this enables fault data and/or error bits originating from the host interface circuitry 202, inter-chip communications circuits 206 and data processing circuits 208 and conveyed via the internal ring 205 to be transferred to the external ring 207 for further conveyance to the host system 10 via the host interface circuitry 202 and/or to another chip 102 elsewhere in the array 100 via a local inter-chip communications circuit 206. Conversely, transfers from the external ring 207 to the internal ring 205 may be done via an external-to-internal ring transfer circuit 224b from the external ring register 214b to the internal ring register 214a. As discussed above (and in further detail below), this enables data and/or instructions originating from the host system 10 and received via the host interface circuitry 202, and/or originating from another chip 102 elsewhere in the array 100 and received via a local inter-chip communications circuit 206, to be transferred to the internal ring 205 for further conveyance to one or more local data processing circuits 208. In the case of the CCU 204 resident on the chip 102b with active host interface circuitry 202 that provides an interface to and from the host system 10, a routing table 226 may be included and populated with routing information (e.g., in the form of spanning tree connections) for local segments of the external ring 207 within the current chip 102 that exchange packets with predetermined inter-chip signal paths among other chips 102 in the array 100. This may advantageously minimize delays by avoiding excessively lengthy signal paths, as well as prevent potential data bottlenecks and/or collisions occurring due to multiple possible signal paths for any given data transfer.

In accordance with the discussion above, one example of a transaction in which a fault may be detected and reported back to the host may proceed as follows. Following a system initialization event, such as a POST or system reboot, a fault may be detected by one or more of the active chips 102 within the array 100. As discussed above, fault data and one or more error bits as appropriate may be generated and stored in the associated CSR 212a and/or error register 212b by the affected host interface circuitry 202, inter-chip communications circuit 206 or data processing circuit 208. In the case of a chip 102b in which the local host interface circuitry 202 is enabled, such fault data and/or error bits may be reported directly to the host system 10. Alternatively, in the case of a remote chip 102 elsewhere in the array 100, the fault data and/or error bits may be reported via one or more inter-chip transfers, e.g., via a path determined using a Distance-Vector routing protocol.

The host system 10 responds by initiating a query to determine the location of the fault (i.e., the chip 102 and its affected host interface circuitry 202, inter-chip communications circuit 206 or data processing circuit 208) and its type, severity, etc. This query from the host system 10 is sent over the host-chip interface 11 (e.g., via a base address register (BAR) in the case of a PCIE interface) for further conveyance via the external ring 207 to the CCU 204, where a security check may first be performed to ensure the validity of the query. If the query is intended for the local chip 102b, the CCU 204 transfers it to the internal ring 205 for further conveyance to the local inter-chip communications circuit(s)

206 and data processing circuit(s) 208. If the query is intended for a remote chip 102, the CCU 204 transfers it to the inter-chip communications circuit 206 associated with the spanning tree path in conformance with the routing table 226 within the CCU 204. it will be passed on to the destination chip 102 via the external ring 207. This enables maintaining of end-to-end security between a destination CCU 204 and requesting host interface 202 without requiring that intermediate nodes routing the packets be trusted.

In both cases, the query ultimately reaches the resident host interface circuitry 202, inter-chip communications circuit(s) 206 and data processing circuit(s) 208 of unaffected chips as well as the affected chip. In each case, by explicit addressing, the host will walk through the address space reading back fault information from each CSR. For unaffected circuits 202, 206, 208, no fault(s) or error(s) are identified, so the query is passed on to the next one or more circuits 202, 206, 208. For affected circuits 202, 206, 208, fault(s) or error(s) are identified, so the query is no longer passed along (e.g., the packet may be deemed "consumed" or terminated). This affected circuit then generates a response packet confirming its identity and its fault(s) or error(s), which is loaded into the register 210*a* for conveyance back to the host system 10 via the inter-chip communications circuit(s) 206 and host interface circuitry 202 in conformance with vector route table data contained within the packet, with no further interaction among downstream CSRs 212*a*.

The above description illustrates various embodiments of the present disclosure along with examples of how aspects of the particular embodiments may be implemented. The above examples should not be deemed to be the only embodiments and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A network of interconnected processing circuit chips, a processing circuit chip in the network comprising:
   an internal signal ring;
   an external signal ring; and
   a plurality of circuits coupled to the internal and external signal rings, the plurality of circuits configured to:
      capture, via the external signal ring, external fault data originating from a first of the processing circuit chips in the network and comprising information about a fault detected at the first processing circuit chip,
      pass the captured external fault data via the external signal ring to a first communication path outside of the processing circuit chip for conveyance of the external fault data to one of the processing circuit chips in the network,
      transfer, from the internal signal ring to the external signal ring, internal fault data originating from an internal circuit of the processing circuit chip and comprising information about another fault detected at the internal circuit,
      pass the internal fault data via the external signal ring to a second communication path outside of the processing circuit chip for conveyance of the internal fault data to a second of the processing circuit chips,
      receive, from the second processing circuit chip, a query for determining an origin of the fault, and
      transfer the query via the external signal ring to a control circuit of the processing circuit chip, the control circuit configured to:
         determine a validity of the query,
         transfer the query via the external signal ring to an inter-chip circuit of the plurality of circuits, in response to the determined validity indicating the query is not intended for the processing circuit chip, and
         pass the query from the inter-chip circuit to a third communication path outside of the processing circuit chip for conveyance of the query to the first processing circuit chip.

2. The network of claim 1, wherein the external signal ring is configured to:
   transfer the captured external fault data to a circuit of the plurality of circuits coupled to the first communication path based on routing data.

3. The network of claim 1, wherein the control circuit is further configured to:
   transfer the query via the external signal ring to the inter-chip circuit of the plurality of circuits coupled to the third communication path based on routing data.

4. The network of claim 1, wherein:
   a chip status register (CSR) of the processing circuit chip does not comprise any portion of the information about the fault; and
   the control circuit is further configured to:
      read content of the CSR in response to the query, and
      determine that the query is not intended for the processing circuit chip, based on the content of the CSR.

5. A network of interconnected processing circuit chips, a processing circuit chip in the network comprising:
   an internal signal ring;
   an external signal ring; and
   a plurality of circuits coupled to the internal and external signal rings, the plurality of circuits configured to:
      capture, via the external signal ring, external fault data originating from a first of the processing circuit chips in the network and comprising information about a fault detected at the first processing circuit chip,
      pass the captured external fault data via the external signal ring to a first communication path outside of the processing circuit chip for conveyance of the external fault data to one of the processing circuit chips in the network,
      transfer, from the internal signal ring to the external signal ring, internal fault data originating from an internal circuit of the processing circuit chip and comprising information about another fault detected at the internal circuit,
      pass the internal fault data via the external signal ring to a second communication path outside of the processing circuit chip for conveyance of the internal fault data to a second of the processing circuit chips,
      receive, from the second processing circuit chip, a query for determining an origin of the other fault; and
      transfer the query via the external signal ring to a control circuit of the processing circuit chip, the control circuit configured to:
         determine a validity of the query, and
         transfer the query from the control circuit to the internal signal ring for conveyance of the query via the internal signal ring to at least one data processing circuit of the processing circuit chip, in response to the determined validity indicating the query is intended for the processing circuit chip.

6. The network of claim 5, wherein the processing circuit chip generates a response confirming that the other fault originated from the processing circuit chip, in response to the determined validity indicating the query is intended for the processing circuit chip.

7. The network of claim 6, wherein:
the internal signal ring is configured to transfer the response to an inter-chip circuit of the plurality of circuits, and
the inter-chip circuit is configured to pass the response to a third communication path outside of the processing circuit chip for conveyance of the response to the second processing circuit chip.

8. The network of claim 7, wherein the internal signal ring is further configured to transfer the response to the inter-chip circuit coupled to the third communication path based on routing data.

9. The network of claim 5, wherein:
at least one register of the processing circuit chip is loaded with at least a portion of the information about the other fault detected at the internal circuit of the processing circuit chip; and
the control circuit is further configured to:
read content of the at least one register in response to the query, and
determine that the query is intended for the processing circuit chip, based on the content of the at least one register.

10. A device of a network of interconnected devices, the device comprising:
an internal signal ring;
an external signal ring; and
a plurality of circuits coupled to the internal signal ring and the external signal ring, the plurality of circuits configured to:
capture, via the external signal ring, external fault data originating from another device in the network and comprising information about a fault detected at the other device,
pass the captured external fault data via the external signal ring to a first communication path outside of the device for conveyance of the external fault data to one of the devices in the network,
transfer, from the internal signal ring to the external signal ring, internal fault data originating from an internal circuit of the device and comprising information about another fault detected at the internal circuit,
pass the internal fault data via the external signal ring to a second communication path outside of the device for conveyance of the internal fault data to a host device in the network,
receive, from the host device, a query for determining an origin of the fault, and
transfer the query via the external signal ring to a control circuit of the device, the control circuit configured to:
determine a validity of the query,
transfer the query via the external signal ring to an inter-chip circuit of the plurality of circuits based on routing data, in response to the determined validity indicating the query is not intended for the device, and
pass the query from the circuit to a third communication path outside of the device for conveyance of the query to the other device.

11. The device of claim 10, wherein the external signal ring is configured to:
transfer the captured external fault data to an inter-chip circuit of the plurality of circuits coupled to the first communication path based on routing data.

12. The device of claim 10, wherein:
a chip status register (CSR) of the device does not comprise any portion of the information about the fault; and
the control circuit is further configured to:
read content of the CSR in response to the query, and
determine that the query is not intended for the device, based on the content of the CSR.

13. The device of claim 10, wherein the plurality of circuits is further configured to:
receive, from the host device, another query for determining an origin of the other fault; and
transfer the other query via the external signal ring to the control circuit, the control circuit further configured to:
determine a validity of the other query, and
transfer the other query from the control circuit to the internal signal ring for conveyance of the other query via the internal signal ring to at least one data processing circuit of the device, in response to the determined validity indicating the other query is intended for the device.

14. The device of claim 13, wherein:
a circuit of the plurality of circuits is configured to generate a response confirming that the other fault originated from the device, in response to the determined validity indicating the other query is intended for the device;
the internal signal ring is configured to transfer the response to an inter-chip circuit of the plurality of circuits coupled to a fourth communication path based on other routing data; and
the inter-chip circuit is configured to pass the response to the fourth communication path outside of the device for conveyance of the response to the host device.

15. The device of claim 13, wherein:
at least one register of the device is loaded with at least a portion of the information about the other fault detected at the internal circuit of the device; and
the control circuit is further configured to:
read content of the at least one register in response to the other query, and
determine that the other query is intended for the device, based on the content of the at least one register.

* * * * *